(12) United States Patent
Gao et al.

(10) Patent No.: US 11,728,769 B2
(45) Date of Patent: Aug. 15, 2023

(54) FAULT DETECTION APPARATUS AND METHOD, AND GRID-TIED PHOTOVOLTAIC POWER GENERATION SYSTEM

(71) Applicant: Huawei Digital Power Technologies Co., Ltd., Shenzhen (CN)

(72) Inventors: Yongbing Gao, Shanghai (CN); Yunyu Tang, Shanghai (CN); Lei Shi, Shanghai (CN)

(73) Assignee: Huawei Digital Power Technologies Co., Ltd., Shenzhen (CN)

( * ) Notice: Subject to any disclaimer, the term of this patent is extended or adjusted under 35 U.S.C. 154(b) by 0 days.

(21) Appl. No.: 17/673,140

(22) Filed: Feb. 16, 2022

(65) Prior Publication Data

US 2022/0271712 A1 Aug. 25, 2022

(30) Foreign Application Priority Data

Feb. 22, 2021 (CN) .......................... 202110199883.3

(51) Int. Cl.
| | |
|---|---|
| H02S 40/32 | (2014.01) |
| H02J 3/00 | (2006.01) |
| H02S 50/10 | (2014.01) |

(52) U.S. Cl.
CPC .............. *H02S 50/10* (2014.12); *H02J 3/001* (2020.01); *H02S 40/32* (2014.12)

(58) Field of Classification Search
CPC .......... H02S 50/10; H02S 40/32; H02J 3/001; H02J 2300/24; H02J 3/01; H02J 3/381; Y02E 10/56; G01R 31/64; H02H 5/041
See application file for complete search history.

(56) References Cited

U.S. PATENT DOCUMENTS

| | | | | |
|---|---|---|---|---|
| 10,027,120 | B1* | 7/2018 | Zapata | ................... H02J 3/1864 |
| 2008/0284449 | A1* | 11/2008 | Phadke | ................... H02M 1/32 |
| | | | | 324/548 |

(Continued)

FOREIGN PATENT DOCUMENTS

| | | |
|---|---|---|
| CN | 201606193 U | 10/2010 |
| CN | 202076131 U | 12/2011 |

(Continued)

*Primary Examiner* — Rexford N Barnie
*Assistant Examiner* — Thai H Tran
(74) *Attorney, Agent, or Firm* — Maier & Maier, PLLC

(57) ABSTRACT

A fault detection apparatus includes a temperature detection unit, a current detection unit, a controller, and a breaking unit. The temperature detection unit is configured to detect temperatures of the plurality of filter capacitors and output the temperatures to the controller. The current detection unit is coupled to the plurality of filter capacitors and is configured to detect currents of the plurality of filter capacitors and output the currents to the controller. The controller is separately connected to the temperature detection unit, the current detection unit, and the breaking unit, and is configured to: when the received temperature exceeds a first threshold and the received current exceeds a second threshold, control the breaking unit to be disconnected. The breaking unit is connected between the output end of the grid-tied inverter and the plurality of filter capacitors and is configured to be disconnected or connected under control of the controller.

15 Claims, 9 Drawing Sheets

(56) References Cited

U.S. PATENT DOCUMENTS

2014/0139167 A1* 5/2014 Steimer ............... H02M 7/4835
318/494
2015/0378416 A1* 12/2015 Wang ....................... H01G 4/38
713/320

FOREIGN PATENT DOCUMENTS

| CN | 104682432 B | 10/2017 |
| CN | 110912084 A | 3/2020 |
| CN | 111524706 A | 8/2020 |

* cited by examiner

FAULT DETECTION APPARATUS AND METHOD, AND GRID-TIED PHOTOVOLTAIC POWER GENERATION SYSTEM

CROSS-REFERENCE TO RELATED APPLICATION

This application claims priority to Chinese Patent Application No. 202110199883.3, filed on Feb. 22, 2021, which is hereby incorporated by reference in its entirety.

TECHNICAL FIELD

The embodiments relate to the field of photovoltaic power generation, and in particular, to a fault detection apparatus and method, and a grid-tied photovoltaic power generation system.

BACKGROUND

As energy draws increasing more in today's society, power generation technologies are increasingly widely used. In actual application, all types of power generation systems such as a wind turbine, a photovoltaic panel, and a fuel cell need to be tied to a grid by using a grid-tied inverter and transmit power to an alternating current grid.

An output end of the grid-tied inverter is connected to the grid. A point at which the grid-tied inverter and the grid are connected may be referred to as a point of common coupling (PCC) or may be referred to as a grid-tied point. The grid-tied inverter may be configured to convert a direct current received at the input end into an alternating current required by the grid, and then transmit the alternating current to the grid through the grid-tied point.

A high-frequency signal exists in the alternating current that is output from the output end of the grid-tied inverter. If the high-frequency signal is directly transmitted to the grid, normal working of a load connected to the grid may be affected. To filter out the high-frequency signal in the alternating current that is output by the grid-tied inverter, the output end of the grid-tied inverter is usually connected to a filter capacitor. However, due to impact of running duration, a running environment (such as a temperature and humidity), and a running condition of the grid-tied inverter, a capacitance value of the filter capacitor may decrease or even the filter capacitor may fail, which affects running stability of the grid-tied inverter and brings an unpredictable consequence.

Currently, in most failure detection solutions for the grid-tied inverter, a current flowing through the filter capacitor is detected to implement fault detection on the filter capacitor. When the filter capacitor fails or the capacitance value decreases, the filter capacitor is in a low-resistance state, and the current flowing through the filter capacitor increases. When the current flowing through the filter capacitor exceeds a specified threshold, the filter capacitor is disconnected from the grid-tied inverter to ensure stable running of the grid-tied inverter.

In actual application, when being stuck by lightning, the grid releases lightning energy by using the filter capacitor and another component. In this case, the current of the filter capacitor increases suddenly. In this case, filtering the high-frequency signal by the filter capacitor is not affected, but a detection apparatus considers by default that the filter capacitor fails.

In conclusion, a fault detection solution for the filter capacitor is urgently required, to accurately detect whether the filter capacitor is faulty, so that a voltage that is output by the grid-tied inverter is secure output to the grid.

SUMMARY

The embodiments provide a fault detection apparatus and method, and a grid-tied photovoltaic power generation system, to improve accuracy of filter capacitor failure detection and ensure stable running of the grid-tied photovoltaic power generation system.

According to a first aspect, an embodiment provides a fault detection apparatus, and the fault detection apparatus may include a temperature detection unit, a current detection unit, and a controller.

The temperature detection unit is coupled to a plurality of filter capacitors between an output end of a grid-tied inverter and a grid and is configured to detect temperatures of the plurality of filter capacitors and output the temperatures to the controller. The current detection unit is coupled to the plurality of filter capacitors and is configured to detect currents of the plurality of filter capacitors and output the currents to the controller. The controller is separately coupled to the temperature detection unit and the current detection unit and is configured to disconnect the output end of the grid-tied inverter from the plurality of filter capacitors when the received temperature exceeds a first threshold and the received current exceeds a second threshold.

According to the foregoing fault detection solution, when the filter capacitors fail or capacitance values of the plurality of filter capacitors decrease, the filter capacitors are in a low-resistance state, the currents flowing through the plurality of filter capacitors increase, and the temperatures of the plurality of filter capacitors also increase. As a result, a current value detected by the current detection unit and a temperature value detected by the temperature detection unit increase. To avoid a short circuit between two phase wires, the controller disconnects the output end of the grid-tied inverter from the plurality of filter capacitors, to ensure secure running of the grid-tied inverter. If the grid is stuck by lightning, lightning energy needs to be filtered out by using the plurality of filter capacitors, and consequently the current value detected by the current detection unit increases. However, time for releasing the lightning energy is very short, and corresponding time is required for an increase in the temperatures of the plurality of filter capacitors. Therefore, before the temperature value detected by the temperature detection unit increases to the first threshold, the lightning energy is released, and the current value detected by the current detection unit decreases to a normal value. The controller performs controlling to maintain a connection between the output end of the grid-tied inverter and the plurality of filter capacitors, thereby improving fault detection accuracy of the fault detection apparatus.

The plurality of filter capacitors may include a first filter capacitor, a second filter capacitor, and a third filter capacitor; a first output end of the grid-tied inverter is separately connected to the first filter capacitor and a first phase wire of the grid, to form a first grid-tied point; a second output end of the grid-tied inverter is separately connected to the second filter capacitor and a second phase wire of the grid, to form a second grid-tied point; and a third output end of the grid-tied inverter is separately connected to the third filter capacitor and a third phase wire of the grid, to form a third grid-tied point.

In the foregoing case, the temperature detection unit includes a first temperature sensor, a second temperature sensor, and a third temperature sensor.

One end of the first temperature sensor is configured to be coupled to the first filter capacitor, and the other end is connected to the controller, to detect a temperature of the first filter capacitor and output the temperature to the controller. One end of the second temperature sensor is configured to be coupled to the second filter capacitor, and the other end is connected to the controller, to detect a temperature of the second filter capacitor and output the temperature to the controller. One end of the third temperature sensor is configured to be coupled to the third filter capacitor, and the other end is connected to the controller, to detect a temperature of the third filter capacitor and output the temperature to the controller.

According to the foregoing fault detection apparatus, the temperatures of all the filter capacitors can be detected by using the temperature detection unit.

The current detection unit may include a first current sensor, a second current sensor, and a third current sensor.

One end of the first current sensor is configured to be coupled to the first filter capacitor, and the other end is connected to the controller, to detect a current of the first filter capacitor and output the current to the controller. One end of the second current sensor is configured to be coupled to the second filter capacitor, and the other end is connected to the controller, to detect a current of the second filter capacitor and output the current to the controller. One end of the third current sensor is configured to be coupled to the third filter capacitor, and the other end is connected to the controller, to detect a current of the third filter capacitor and output the current to the controller.

According to the foregoing fault detection apparatus, the currents flowing through all the filter capacitors can be detected by using the current detection unit.

The fault detection apparatus may further include a voltage detection unit connected to the controller.

The voltage detection unit is coupled to the plurality of filter capacitors and is configured to detect voltages of the plurality of filter capacitors and output the detected voltages to the controller.

When the voltage detection unit is added, the controller may determine, in the following manner, a moment at which the output end of the grid-tied inverter is connected to the plurality of filter capacitors: When the received temperature exceeds the first threshold, the received current exceeds the second threshold, and the received voltage is beyond a preset threshold interval, the controller disconnects the output end of the grid-tied inverter from the plurality of filter capacitors.

According to the foregoing fault detection apparatus, when the filter capacitor fails, a voltage between two ends of the filter capacitor further changes. Based on this, the voltage detection unit is added to detect the filter capacitor, thereby improving accuracy of filter capacitor failure detection.

The voltage detection unit may include a first voltage sensor, a second voltage sensor, and a third voltage sensor.

One end of the first voltage sensor is configured to be coupled to the first filter capacitor, and the other end is connected to the controller, to detect a first voltage between two ends of the first filter capacitor and output the first voltage to the controller. One end of the second voltage sensor is configured to be coupled to the second filter capacitor, and the other end is connected to the controller, to detect a second voltage between two ends of the second filter capacitor and output the second voltage to the controller.

One end of the third voltage sensor is configured to be coupled to the third filter capacitor, and the other end is connected to the controller, to detect a third voltage between two ends of the third filter capacitor and output the third voltage to the controller.

In a possible implementation, the fault detection apparatus may further include a breaking unit connected to the controller. The breaking unit is connected between the output end of the grid-tied inverter and the plurality of filter capacitors and is configured to be disconnected or connected under control of the controller.

The breaking unit may be implemented in the following two possible implementations based on a connection manner of the plurality of filter capacitors.

Implementation 1 of the breaking unit:

The first filter capacitor, the second filter capacitor, and the third filter capacitor are connected in a star shape, and the breaking unit includes a first switch, a second switch, and a third switch.

The first switch may be connected between the first filter capacitor and the first output end and is configured to connect the first filter capacitor to the first output end. The second switch is connected between the second filter capacitor and the second output end and is configured to connect the second filter capacitor to the second output end. The third switch is connected between the third filter capacitor and the third output end and is configured to connect the third filter capacitor to the third output end.

Implementation 2 of the breaking unit:

The first filter capacitor, the second filter capacitor, and the third filter capacitor are connected in a triangle shape, and the breaking unit includes a fourth switch and a fifth switch.

The fourth switch is connected between the first filter capacitor and the first output end and is configured to connect the first filter capacitor to the first output end. The fifth switch is connected between the second filter capacitor and the second output end and is configured to connect the second filter capacitor to the second output end.

In a possible implementation, the controller is further configured to: when determining that the received temperature exceeds the first threshold and the received current exceeds the second threshold, detect voltages of the first grid-tied point, the second grid-tied point, and the third grid-tied point; when determining that a voltage value of the first grid-tied point is zero, control the first switch to be turned off; when determining that a voltage value of the second grid-tied point is zero, control the second switch to be turned off; and when determining that a voltage value of the third grid-tied point is zero, control the third switch to be turned off.

According to the foregoing fault detection apparatus, the first switch, the second switch, and the third switch can be turned off at a zero voltage, thereby reducing loss when the switch is turned off.

According to a second aspect, an embodiment provides a grid-tied photovoltaic power generation system, and the grid-tied photovoltaic power generation system includes a plurality of photovoltaic modules, a grid-tied inverter, a plurality of filter capacitors, and the foregoing fault detection apparatus.

The photovoltaic modules are connected to the grid-tied inverter and are configured to convert optical energy into a direct current and output the direct current to the grid-tied inverter. The grid-tied inverter is separately connected to the plurality of filter capacitors and a grid and is configured to convert the received direct current into an alternating current, and then output the alternating current to the grid and the plurality of filter capacitors. The filter capacitors are configured to perform filtering processing on the received alternating current and output an alternating current obtained after filtering processing to the grid. The fault detection apparatus is coupled to the plurality of filter capacitors and is separately connected to the grid-tied inverter and the grid and is configured to detect whether the filter capacitors are faulty and disconnect the plurality of filter capacitors from the grid and the grid-tied inverter when the plurality of filter capacitors are faulty.

According to the foregoing grid-tied photovoltaic power generation system, the foregoing fault detection apparatus may be used to accurately detect whether the filter capacitors are faulty, to ensure that electric energy that is output by the plurality of photovoltaic modules can be accurately tied to the grid.

According to a third aspect, an embodiment provides a fault detection method. The fault detection method may be executed by the controller in the foregoing fault detection apparatus, and may include the following steps:

detecting currents and temperatures of a plurality of filter capacitors between an output end of a grid-tied inverter and a grid; and disconnecting the plurality of filter capacitors from the grid-tied inverter and the grid when the temperatures of the plurality of filter capacitors exceed a first threshold and the currents of the plurality of filter capacitors exceed a second threshold.

According to the foregoing method, whether the filter capacitors are faulty may be determined based on two factors: the current and the temperature. If the grid is stuck by lightning, lightning energy needs to be filtered out by using the plurality of filter capacitors, which causes an increase in a current value detected by a current detection unit. However, time for releasing the lightning energy is very short, and corresponding time is required for an increase in the temperatures of the plurality of filter capacitors. Therefore, before a temperature value detected by a temperature detection unit increases to the first threshold, the lightning energy is released, and the current value detected by the current detection unit decreases to a normal value. The controller controls a breaking unit to maintain a connection between the filter capacitors, thereby improving fault detection accuracy of the fault detection apparatus.

The method may further include: detecting voltages of the plurality of filter capacitors; and the disconnecting the plurality of filter capacitors from the grid-tied inverter and the grid when the temperatures of the plurality of filter capacitors exceed a first threshold and the currents of the plurality of filter capacitors exceed a second threshold includes: disconnecting the plurality of filter capacitors from the grid-tied inverter and the grid when the temperatures of the plurality of filter capacitors exceed the first threshold, the currents of the plurality of filter capacitors exceed the second threshold, and the voltages of the plurality of filter capacitors are beyond a preset threshold interval.

According to the foregoing method, when the plurality of filter capacitors fail, a voltage between two ends of each of the plurality of filter capacitors further changes. Based on this, the voltage between the two ends of each of the plurality of filter capacitors is detected, and the voltage is used as one of conditions for determining whether the filter capacitor fails.

In a possible implementation, the plurality of filter capacitors include a first filter capacitor, a second filter capacitor, and a third filter capacitor; a first output end of the grid-tied inverter is separately connected to the first filter capacitor and a first phase wire of the grid, to form a first grid-tied point; a second output end of the grid-tied inverter is separately connected to the second filter capacitor and a second phase wire of the grid, to form a second grid-tied point; and a third output end of the grid-tied inverter is separately connected to the third filter capacitor and a third phase wire of the grid, to form a third grid-tied point.

When the plurality of filter capacitors are disconnected from the grid-tied inverter and the grid, voltages of the first grid-tied point, the second grid-tied point, and the third grid-tied point may be detected. When it is determined that the voltage of the first grid-tied point is zero, the first filter capacitor is disconnected from the first phase wire and the first output end. When it is determined that the voltage of the second grid-tied point is zero, the second filter capacitor is disconnected from the second phase wire and the second output end. When it is determined that the voltage of the third grid-tied point is zero, the third filter capacitor is disconnected from the third phase wire and the third output end.

DETAILED DESCRIPTION OF THE EMBODIMENTS

Objectives, solutions, and advantages are detailed with reference to the accompanying drawings. An exemplary operation method in a method embodiment may also be applied to an apparatus embodiment or a system embodiment. It should be noted that in the description, "at least one" means one or more, and "a plurality of" means two or more. In view of this, "a plurality of" may also be understood as "at least two" in the embodiments. The term "and/or" describes an association relationship for describing associated objects and represents that three relationships may exist. For example, A and/or B may represent the following three cases: Only A exists, both A and B exist, and only B exists. In addition, the character "/" usually indicates an "or" relationship between the associated objects. In addition, it should be understood that, in the descriptions, terms such as "first" and "second" are merely used for distinguishing and description but cannot be understood as indicating or implying relative importance or indicating or implying an order.

It should be noted that the "connection" in the embodiments refers to an electric connection, and the connection between two electrical elements may be a direct or indirect connection between the two electrical elements. For example, a connection between A and B may represent that A and B are directly connected to each other, or A and B are indirectly connected to each other by using one or more other electrical elements. For example, the connection between A and B may also represent that A is directly connected to C, C is directly connected to B, and A and B are connected to each other through C.

Figure 1:
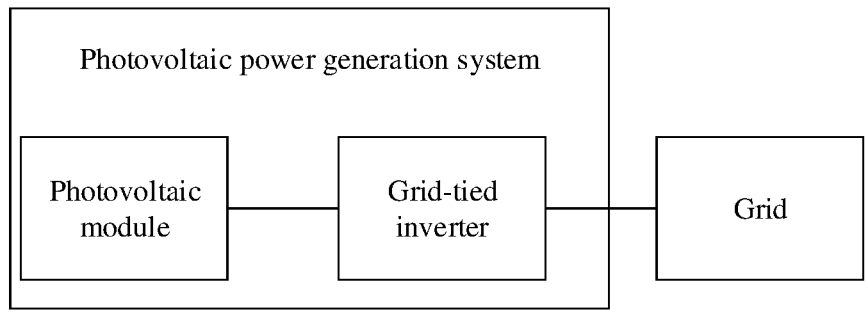
FIG. 1 is a schematic diagram of a structure of a photovoltaic power generation system according to an embodiment.

A fault detection apparatus provided in the embodiments may be applied to a photovoltaic power generation system. FIG. 1 is a schematic diagram of a structure of a photovoltaic power generation system applicable to an embodiment. As shown in FIG. 1, the photovoltaic power generation system mainly includes a plurality of photovoltaic modules and a grid-tied inverter.

The photovoltaic modules may be connected to the grid-tied inverter. Each of the plurality of photovoltaic modules may convert received optical energy into electric energy in a form of a direct current and output the direct current to the grid-tied inverter. The grid-tied inverter may convert the received direct current into an alternating current and output the alternating current.

An output end of the grid-tied inverter in the photovoltaic power generation system may be connected to a grid and is configured to perform grid-tied processing on electric energy generated by the photovoltaic power generation system, to supply power to a load connected to the grid. The grid is a three-phase grid, and a point at which the output end of the grid-tied inverter and the grid are connected may be referred to as a PCC or may be referred to as a grid-tied point.

Figure 2:
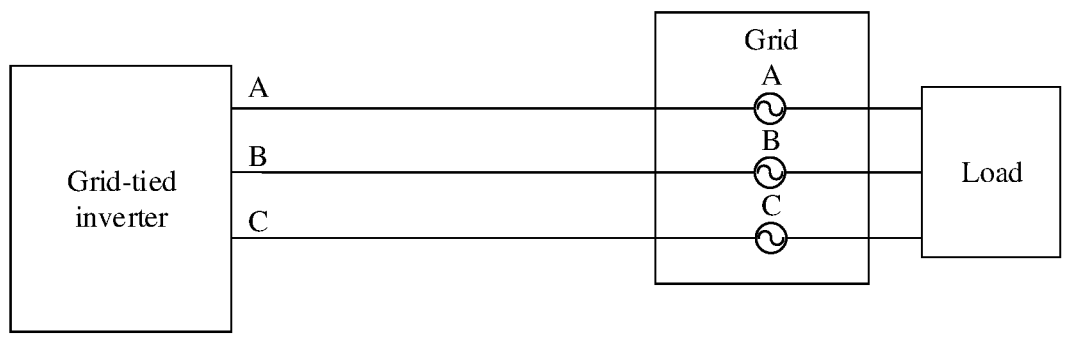
FIG. 2 is a schematic diagram of grid-tying of a photovoltaic power generation system according to an embodiment.

FIG. 2 is a schematic diagram of grid-tying of a photovoltaic power generation system. As shown in FIG. 2, there are three output ports A, B, and C at an output end of a grid-tied inverter, which are configured to output a three-phase alternating current.

The output port A is connected to a phase wire A of a grid to form a first grid-tied point, the output port B is connected to a phase wire B of the grid to form a second grid-tied point, and the output port C is connected to a phase wire C of the grid to form a third grid-tied point. The grid is a three-phase grid.

In actual use, the alternating current that is output by the grid-tied inverter includes a large quantity of high-frequency signals. If the high-frequency signal is directly transmitted to the grid, quality of electric energy of the grid is directly affected, or even some precision loads connected to the grid are damaged in serious cases. Based on this, a plurality of filter capacitors may be disposed at a grid-tied point, and the filter capacitor may filter out the high-frequency signal in the alternating current that is output by the grid-tied inverter, to ensure quality of the electric energy that is output to the grid.

There may be various manners of connecting filter capacitors configured to filter out the high-frequency signal in the alternating current that is output by the grid-tied inverter. A manner of connecting the filter capacitors is described below with reference to the accompanying drawings.

Figure 3:
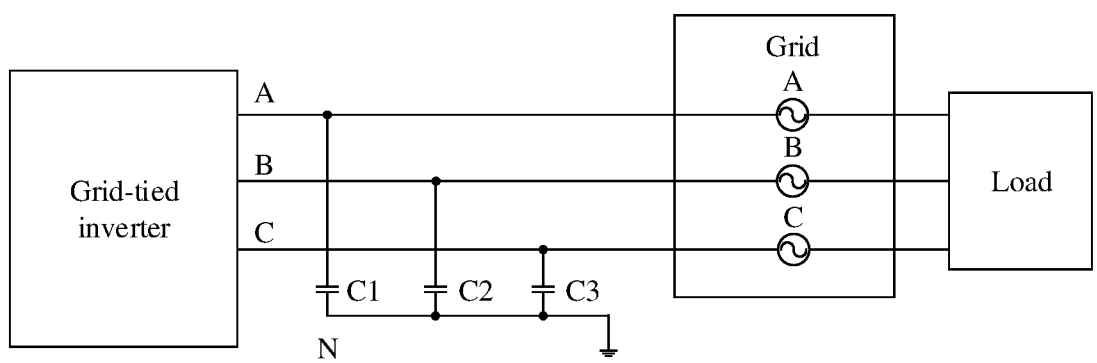
FIG. 3 is a schematic diagram of a connection between filter capacitors according to an embodiment.

FIG. 3 is a schematic diagram of a connection between the filter capacitors. As shown in FIG. 3, a first filter capacitor C1 is connected between the output port A of the grid-tied inverter and a neutral wire (N), a second filter capacitor C2 is connected between the output port B of the grid-tied inverter and N, and a third filter capacitor C3 is connected between the output port C of the grid-tied inverter and N. It should be noted that N herein may be N in the photovoltaic power generation system or may be N in the grid. This is not limited herein.

The filter capacitors C1, C2, and C3 may be connected in a star shape.

Figure 4:
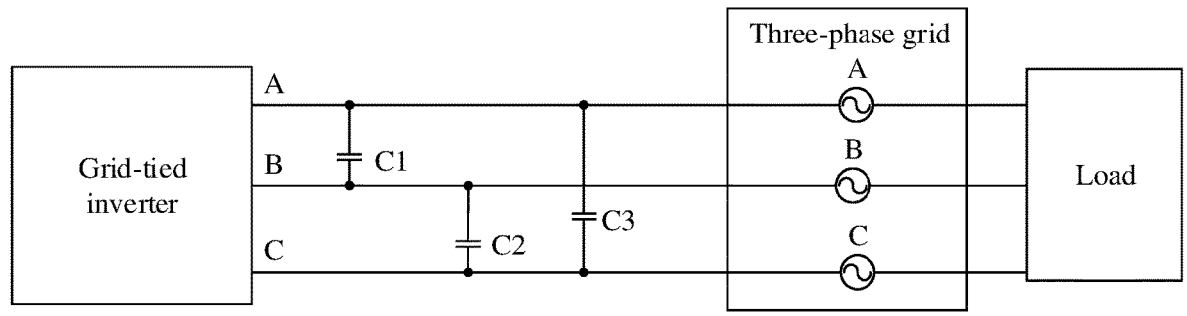
FIG. 4 is a schematic diagram of another connection between filter capacitors according to an embodiment.

FIG. 4 is a schematic diagram of another connection between the filter capacitors. As shown in FIG. 4, a filter capacitor C1 is connected between the output port A and the output port B of the grid-tied inverter, a filter capacitor C2 is connected between the output port B and the output port C of the grid-tied inverter, and a filter capacitor C3 is connected between the output port C and the output port A of the grid-tied inverter.

The filter capacitors C1, C2, and C3 may be connected in a triangular shape.

It should be noted that in the foregoing two manners of connecting filter capacitors, a capacitance value of the filter capacitor may be set based on an output voltage of the grid-tied inverter and an application scenario of the photovoltaic power generation system. This is not described in detail in this embodiment.

In actual use, when a filter capacitor is used for a long time or is faulty, the capacitor fails. Two cases are presented if the filter capacitor fails. In a first case, the filter capacitor presents an open-circuit state. In a second case, a capacitance value of the filter capacitor decreases or even decreases to zero, and the filter capacitor presents a short circuit state. When the second case occurs if the filter capacitor fails, the grid-tied point is short circuited, that is, a short circuit occurs between two phase wires of the grid and a short circuit occurs between two output ports of the grid-tied inverter, which directly affects security of the photovoltaic power generation system and a load connected to the grid.

Currently, filter capacitor failure detection mainly includes detecting a current flowing through a filter capacitor. A principle of the failure detection is as follows: When the filter capacitor fails to cause a decrease in a capacitance value of the filter capacitor, the current flowing through the filter capacitor increases. Therefore, when a current of any one of the three filter capacitors exceeds a specified value, it is determined that the filter capacitor fails. In the art, there are a plurality of cases causing a change in a current flowing through a filter capacitor. For example, when the grid-tied inverter or the grid is struck by lightning, lightning energy may be released by using a filter capacitor connected to the grid-tied point. As a result, a current flowing through the filter capacitor suddenly increases and exceeds a specified value. In this case, in the foregoing failure detection manner, it is directly considered by default that the filter capacitor fails. However, after the filter capacitor releases the lightning energy, the filter capacitor can still filter out a high-frequency signal in an alternating current that is output by the grid-tied inverter, and the filter capacitor is not damaged to fail. Therefore, detection accuracy of the foregoing filter capacitor failure detection manner cannot be ensured.

The fault detection apparatus may be applied to a photovoltaic power generation system and cannot only meet a grid tying requirement of the photovoltaic power generation system, but also help improve accuracy of filter capacitor failure detection.

Figure 5:
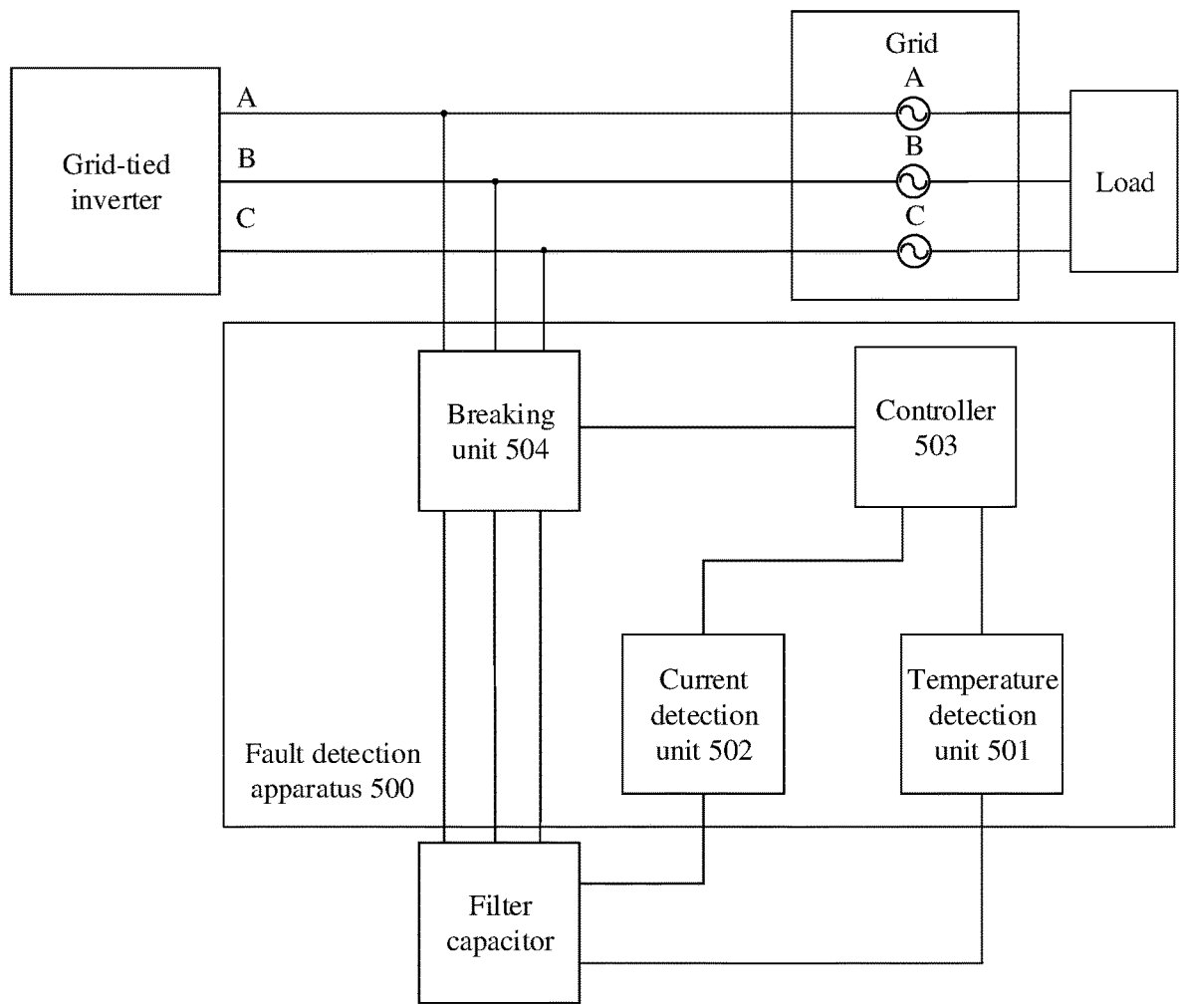
FIG. 5 is a schematic diagram of a structure of a fault detection apparatus according to an embodiment of this application.

As shown in FIG. 5, a fault detection apparatus 500 may include a temperature detection unit 501, a current detection unit 502, and a controller 503.

The temperature detection unit 501 is coupled to a plurality of filter capacitors between an output end of a grid-tied inverter and a grid, the current detection unit 502 is coupled to the plurality of filter capacitors, and the controller 503 is separately connected to the temperature detection unit 501 and the current detection unit 502.

The temperature detection unit 501 may be configured to detect temperatures of the plurality of filter capacitors and output the temperatures to the controller 503. The current detection unit 502 may be configured to detect currents of the plurality of filter capacitors and output the currents to the controller 503. The controller 503 may be configured to disconnect the output end of the grid-tied inverter from the plurality of filter capacitors when the received temperature exceeds a first threshold and the received current exceeds a second threshold.

When the fault detection apparatus 500 provided in this embodiment is used to detect whether the plurality of filter capacitors fail The failure may be accurately detected by using two factors: the temperature and the current. For example, when the photovoltaic power generation system or the grid is struck by lightning and releases lightning energy by using the plurality of filter capacitors, although the currents flowing through the plurality of filter capacitors suddenly increase due to the lightning energy to exceed the second threshold, an increase in the temperatures of the plurality of filter capacitors requires time accumulation. Before the temperatures of the plurality of filter capacitors increase to the first threshold, the lightning energy is released, and the filter capacitors cannot simultaneously meet specified values of the two parameters: the current and the temperature. Therefore, a failure caused by lightning may be effectively avoided, so that accuracy of filter capacitor failure detection is improved, thereby ensuring that the photovoltaic power generation system is normally tied to the grid.

In a possible implementation, the fault detection apparatus 500 may further include a breaking unit 504 connected to the controller 503. The breaking unit 504 may be connected between the output end of the grid-tied inverter and the plurality of filter capacitors and may be disconnected or connected under control of the controller 503.

When the received temperature exceeds the first threshold and the received current exceeds the second threshold, the controller 503 may send a control signal to the breaking unit 504. After receiving the control signal, the breaking unit 504 disconnects the output end of the grid-tied inverter from the plurality of filter capacitors.

In another possible implementation, the photovoltaic power generation system further includes a breaking apparatus connected between the output end of the grid-tied inverter and the plurality of filter capacitors, and the controller 503 may be connected to the breaking apparatus.

When the received temperature exceeds the first threshold and the received current exceeds the second threshold, the controller 503 may send a control signal to the breaking apparatus. After receiving the control signal, the breaking apparatus disconnects the output end of the grid-tied inverter from the plurality of filter capacitors.

In actual application, the fault detection apparatus 500 may be fixed to the photovoltaic power generation system.

In another implementation, the fault detection apparatus 500 may be disposed in a flexible and detachable form. A fixed interface may be disposed in the photovoltaic power generation system, and the fault detection apparatus 500 may be connected to the photovoltaic power generation system through the interface. In this case, the fault detection apparatus 500 may be considered as an apparatus independent of the photovoltaic power generation system.

In a grid-tying process of the photovoltaic power generation system, if the filter capacitor fails, a plurality of other parameters may change, for example, a voltage between two ends of each of the plurality of filter capacitors changes. To further improve accuracy of filter capacitor failure detection, the fault detection apparatus 500 provided in this embodiment may further include a voltage detection unit 505 connected to the controller 503.

The voltage detection unit 505 may be coupled to the plurality of filter capacitors and may be configured to detect voltages of the plurality of filter capacitors and output the detected voltages to the controller 503.

Figure 6:
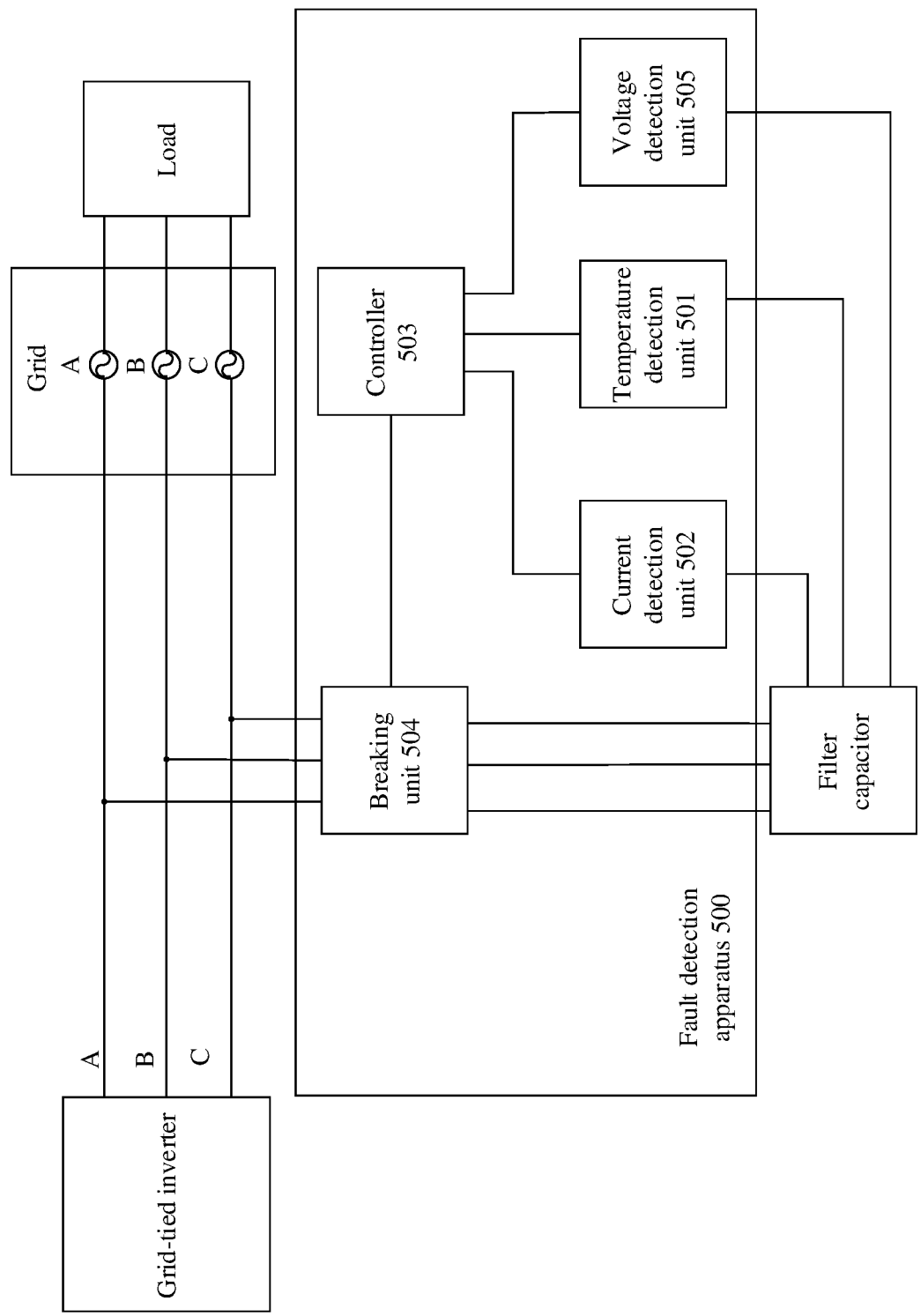
FIG. 6 is a schematic diagram of a structure of another fault detection apparatus according to an embodiment.

When the fault detection apparatus 500 shown in FIG. 6 is used to detect whether the filter capacitor fails, the controller 503 may be configured to: when the received temperature exceeds the first threshold, the received current exceeds the second threshold, and the received voltage is beyond a preset threshold interval, control the breaking unit 504 to be disconnected.

Structures of the temperature detection unit 501, the current detection unit 502, the voltage detection unit 505, the breaking unit 504, and the controller 503 in the fault detection apparatus 500 are described below.

I. Temperature Detection Unit 501

The temperature detection unit 501 is coupled to the plurality of filter capacitors configured to filter out a high-frequency signal and is connected to the controller 503 and may be configured to detect temperatures of the plurality of coupled filter capacitors and output the detected temperatures to the controller 503.

The temperature detection unit 501 may include a first temperature sensor, a second temperature sensor, and a third temperature sensor.

One end of the first temperature sensor is configured to be coupled to a first filter capacitor, and the other end is connected to the controller 503, to detect a temperature of the first filter capacitor and output the temperature to the controller 503. One end of the second temperature sensor is configured to be coupled to a second filter capacitor, and the other end is connected to the controller 503, to detect a temperature of the second filter capacitor and output the temperature to the controller 503. One end of the third temperature sensor is configured to be coupled to a third filter capacitor, and the other end is connected to the controller 503, to detect a temperature of the third filter capacitor and output the temperature to the controller 503.

It should be noted that the temperature sensor provided in this embodiment may be a non-contact temperature sensor or may be a contact temperature sensor. This is not limited herein in this embodiment.

That the temperature sensor in the temperature detection unit 501 is a surface-mount temperature sensor in the contact temperature sensor is used as an example below for description with reference to FIG. 7.

For ease of understanding, an example of a structure of the temperature detection unit 501 is provided below.

Figure 7:
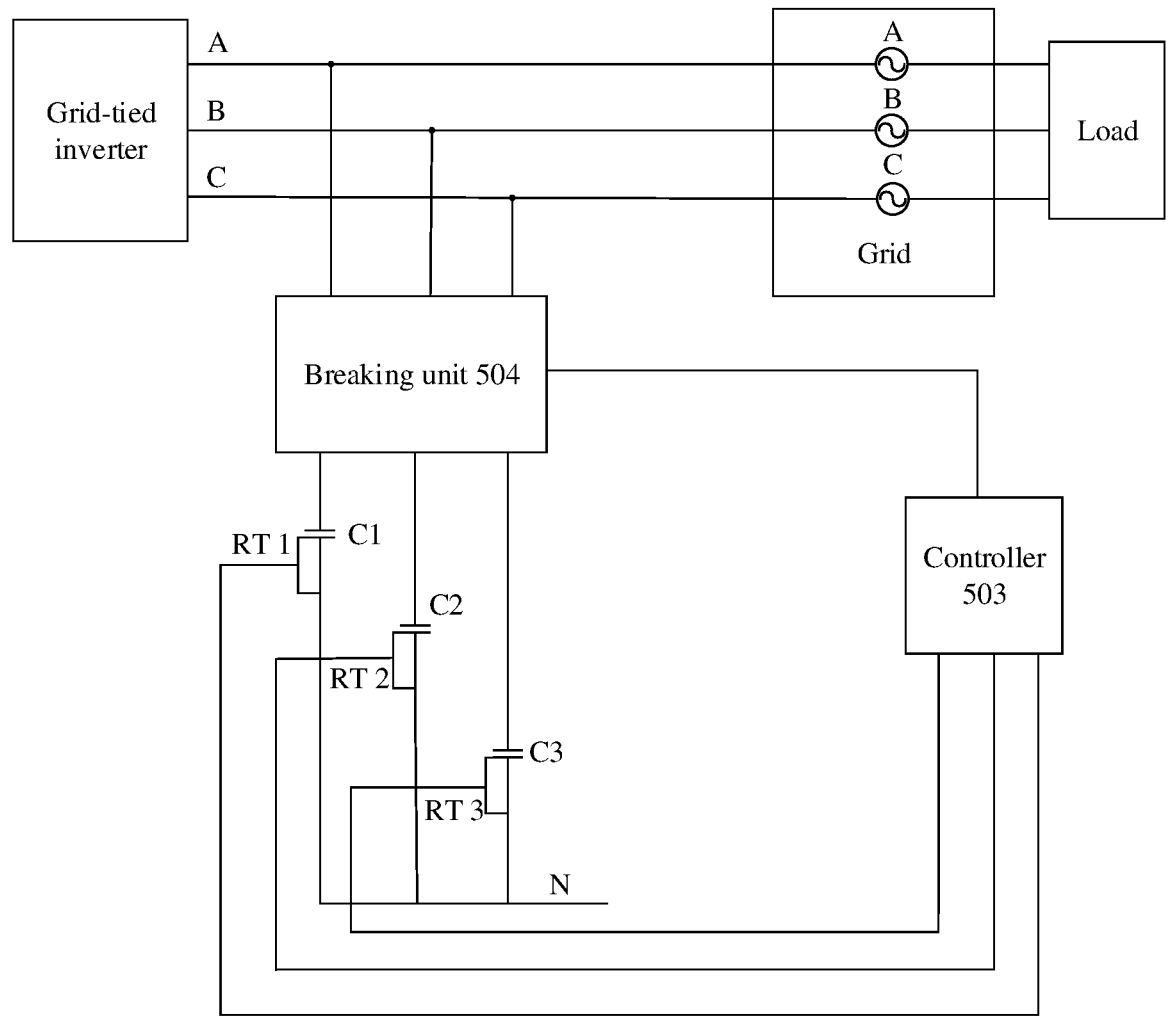
FIG. 7 is a schematic diagram of a structure of a temperature detection unit according to an embodiment.

FIG. 7 is a schematic diagram of a structure of a temperature detection unit 501 according to an embodiment. In FIG. 7, RT 1 forms the first temperature sensor, RT 2 forms the second temperature sensor, and RT 3 forms the third temperature sensor. Temperature output ends of RT 1, RT 2, and RT 3 are separately connected to the controller 503.

Connection relationships of the components in the temperature detection unit 501 shown in FIG. 7 may be as follows: RT 1 is in contact with a first filter capacitor C1, RT 2 is in contact with a second filter capacitor C2, and RT 3 is in contact with a third filter capacitor C3, and the temperature output ports of RT 1, RT 2, and RT 3 are all connected to the controller 503.

In actual use, because RT 1 is a surface-mount temperature sensor, RT 1 can be attached to C1, so that RT 1 is in contact with the filter capacitor C1. By analogy, all the temperature sensors can be in contact with the filter capacitors.

When the temperature detection unit 501 shown in FIG. 7 is used to detect temperatures of the plurality of filter capacitors, RT 1 detects the temperature of the filter capacitor C1, and outputs the detected temperature to the controller 503 through the temperature output port of RT 1; RT 2 detects the temperature of the filter capacitor C2, and outputs the detected temperature to the controller 503 through the temperature output port of RT 2; and RT 3 detects the temperature of the filter capacitor C3, and outputs the detected temperature to the controller 503 through the temperature output port of RT 3.

The foregoing description of the structure of the temperature detection unit 501 is merely an example. In actual application, the temperature detection unit 501 may use another structure based on a type of the temperature sensor in the temperature detection unit 501. For example, the temperature detection unit 501 may be a thermistor, configured to detect a temperature of a filter capacitor.

II. Current Detection Unit 502

The current detection unit 502 is coupled to the plurality of filter capacitors configured to filter out a high-frequency signal and is connected to the controller 503 and may be configured to detect currents flowing through the plurality of filter capacitors and output the detected currents to the controller 503.

The current detection unit 502 may include a first current sensor, a second current sensor, and a third current sensor.

One end of the first current sensor may be configured to be coupled to a first filter capacitor, and the other end is connected to the controller 503, to detect a current of the first filter capacitor and output the current to the controller 503. One end of the second current sensor is configured to be coupled to a second filter capacitor, and the other end is connected to the controller 503, to detect a current of the second filter capacitor and output the current to the controller 503. One end of the third current sensor is configured to be coupled to a third filter capacitor, and the other end is connected to the controller 503, to detect a current of the third filter capacitor and output the current to the controller 503.

It should be noted that the current sensor provided in this embodiment may be a non-contact current sensor or may be a contact current sensor. This is not limited herein in this embodiment.

The current sensor in the current detection unit 502 is a current transformer in the non-contact current sensor is used as an example below for description with reference to FIG. 8.

For ease of understanding, an example of a structure of the current detection unit 502 is provided below.

Figure 8:
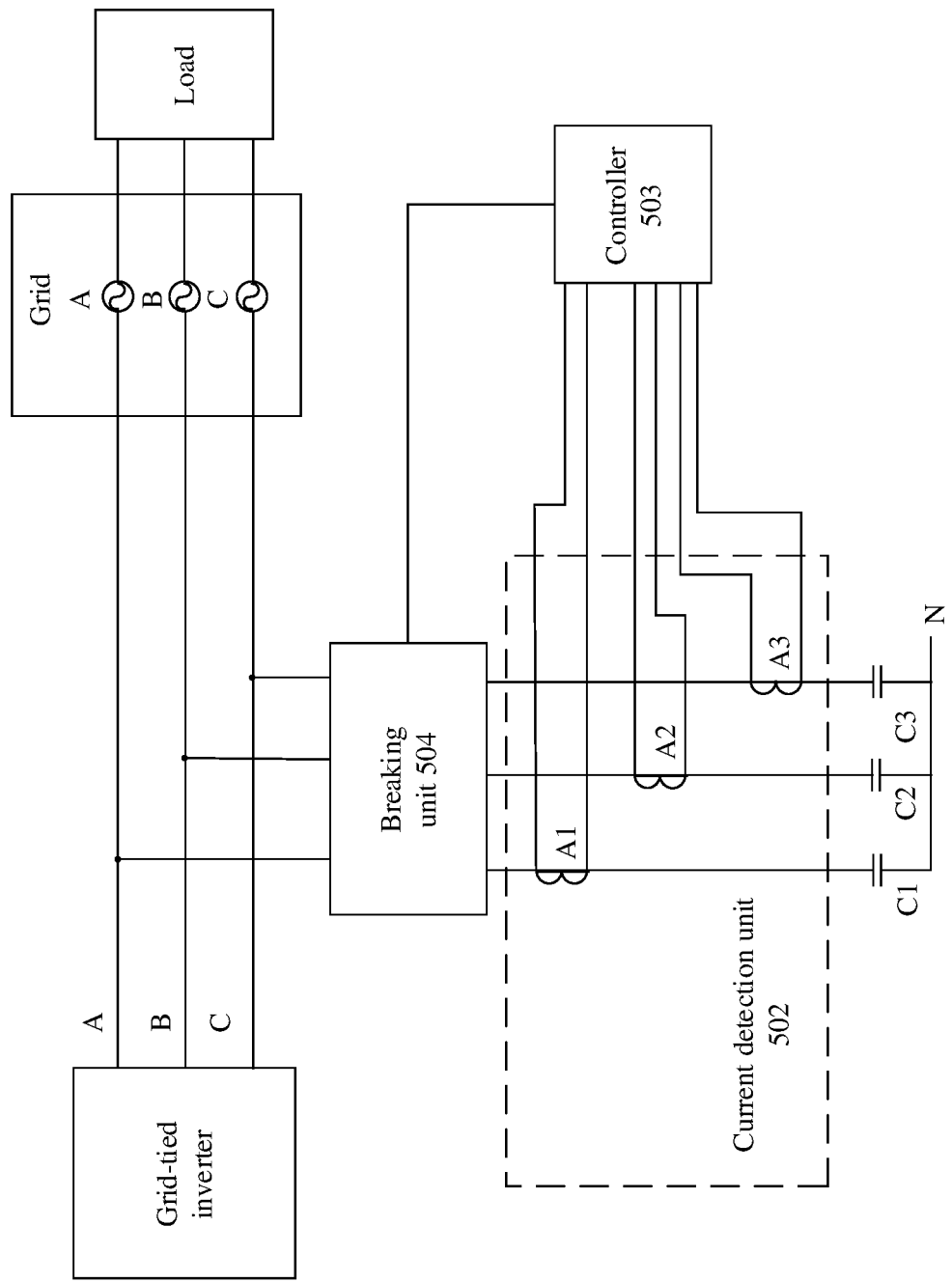
FIG. 8 is a schematic diagram of a structure of a current detection unit according to an embodiment.

FIG. 8 is a schematic diagram of a structure of a current detection unit 502 according to an embodiment. In FIG. 8, A1 forms the first current sensor, A2 forms the second current sensor, and A3 forms the third current sensor. Current output ports of A1, A2, and A3 are separately connected to the controller 503.

Connection relationships of the components in the current detection unit 502 shown in FIG. 8 may be as follows: A detection winding of A1 winds around a branch on which a filter capacitor C1 is located, and the current output port of A1 is connected to the controller 503; a detection winding of A2 winds around a branch on which a filter capacitor C2 is located, and the current output port of A2 is connected to the controller 503; and a detection winding of A3 winds around a branch on which a filter capacitor C3 is located, and the current output port of A3 is connected to the controller 503.

When the current detection unit 502 shown in FIG. 8 is used to detect currents flowing through the plurality of filter capacitors, A1 detects the current flowing through the filter capacitor C1, and outputs the detected current to the controller 503; A2 detects the current flowing through the filter capacitor C2, and outputs the detected current to the controller 503; and A3 detects the current flowing through the filter capacitor C3, and outputs the detected current to the controller 503.

The foregoing description of the structure of the current detection unit 502 is merely an example. In actual application, based on different types of current sensors, the current detection unit 502 may use other structures to detect a current flowing through a filter capacitor. For example, the current sensor may be but is not limited to a shunt or a Hall sensor.

III. Voltage Detection Unit 505

The voltage detection unit 505 is coupled to the plurality of filter capacitors configured to filter out a high-frequency signal and is connected to the controller 503 and may be configured to detect a voltage between two ends of each of the plurality of coupled filter capacitors and output the detected voltage to the controller 503.

The voltage detection unit 505 may include a first voltage sensor, a second voltage sensor, and a third voltage sensor.

One end of the first voltage sensor is configured to be coupled to a first filter capacitor, and the other end is connected to the controller 503, to detect a first voltage between two ends of the first filter capacitor and output the first voltage to the controller 503. One end of the second voltage sensor is configured to be coupled to a second filter capacitor, and the other end is connected to the controller 503, to detect a second voltage between two ends of the second filter capacitor and output the second voltage to the controller 503. One end of the third voltage sensor is configured to be coupled to a third filter capacitor, and the other end is connected to the controller 503, to detect a third voltage between two ends of the third filter capacitor and output the third voltage to the controller 503.

It should be noted that the voltage sensor provided in this embodiment may be a non-contact voltage sensor or may be a contact voltage sensor. This is not limited herein in this embodiment.

That the voltage sensor in the voltage detection unit 505 is a voltage transformer in the non-contact voltage sensor is used as an example below for description with reference to FIG. 9.

For ease of understanding, an example of a structure of the voltage detection unit 505 is provided below.

Figure 9:
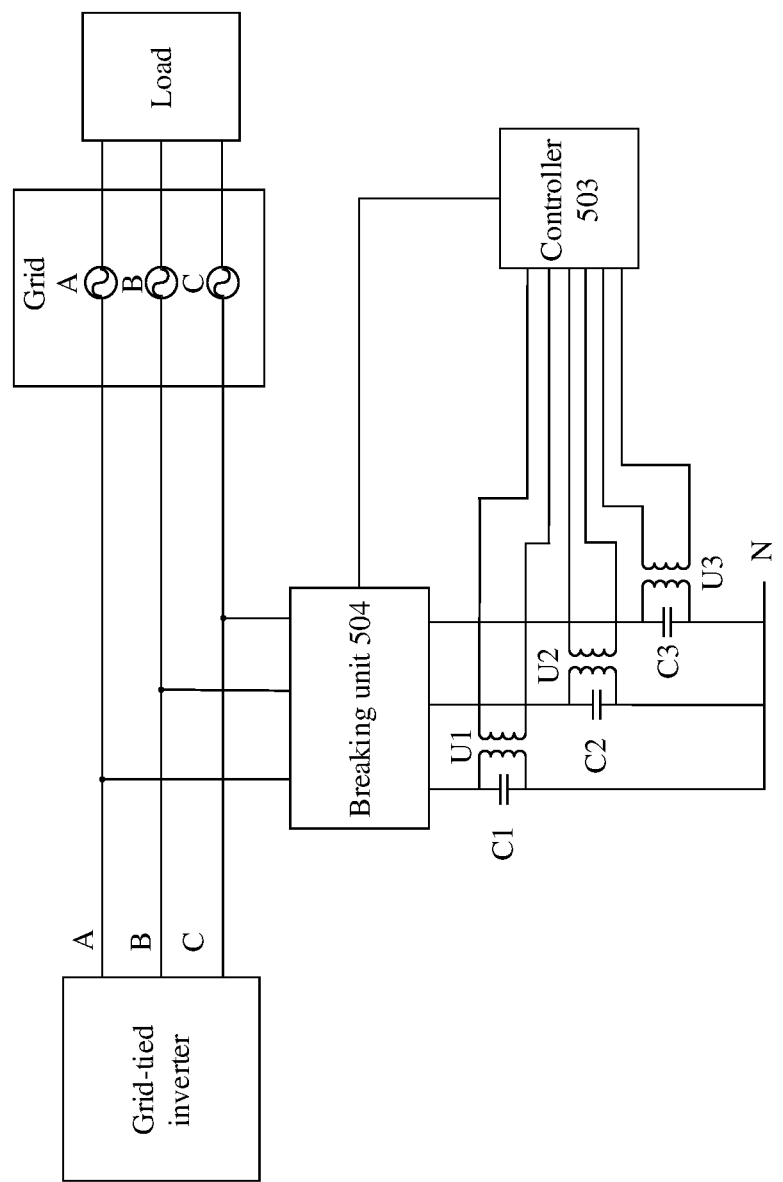
FIG. 9 is a schematic diagram of a structure of a voltage detection unit according to an embodiment.

FIG. 9 is a schematic diagram of a structure of a voltage detection unit 505 according to an embodiment. In FIG. 9, U1 forms the first voltage sensor, U2 forms the second voltage sensor, and U3 forms the third voltage sensor.

Voltage output ports of U1, U2, and U3 are separately connected to the controller 503.

Connection relationships of the components in the voltage detection unit 505 shown in FIG. 9 may be as follows: A detection winding of U1 is connected in parallel between two ends of a first filter capacitor C1, and the voltage output port of U1 is connected to the controller 503; a detection winding of U2 is connected in parallel between two ends of a second filter capacitor C2, and the voltage output port of U2 is connected to the controller 503; and a detection winding of U3 is connected in parallel between two ends of the third filter capacitor C3, and the voltage output port of U3 is connected to the controller 503.

When the voltage detection unit 505 shown in FIG. 9 is used to detect a voltage between two ends of each of the plurality of filter capacitors, U1 detects the voltage between the two ends of the filter capacitor C1, and outputs the detected voltage to the controller 503; U2 detects the voltage between the two ends of the filter capacitor C2, and outputs the detected voltage to the controller 503; and U3 detects the voltage between the two ends of the filter capacitor C3, and outputs the detected voltage to the controller 503.

The foregoing description of the structure of the voltage detection unit 505 is merely an example. In actual application, based on different types of voltage sensors, the voltage detection unit 505 may use other structures to detect a voltage between two ends of a filter capacitor. For example, the voltage sensor is a Hall sensor.

IV. Breaking Unit 504

The breaking unit 504 is connected between the output end of the grid-tied inverter and the plurality of filter capacitors and is configured to be disconnected or connected under control of the controller 503.

The breaking unit 504 may be connected between a grid-tied point and the filter capacitor.

When the breaking unit 504 is in a connected state, the output end of the grid-tied inverter may be connected to the plurality of filter capacitors, and when the breaking unit 504 is in a disconnected state, the output end of the grid-tied inverter may be disconnected from the plurality of filter capacitors.

In actual use, based on the foregoing two manners of connecting filter capacitors in FIG. 3 and FIG. 4, the breaking unit 504 provided in this embodiment has two circuit structures, which are as follows.

Structure 1:

If the filter capacitors are connected in a star shape, the breaking unit 504 may include a first switch, a second switch, and a third switch.

The first switch may be connected between a first filter capacitor and a first output end and is configured to connect the first filter capacitor to the first output end. The second switch is connected between a second filter capacitor and a second output end and is configured to connect the second filter capacitor to the second output end. The third switch is connected between a third filter capacitor and a third output end and is configured to connect the third filter capacitor to the third output end.

The first switch is disposed to control a connection between the first filter capacitor and a first grid-tied point, the second switch is disposed to control a connection between the second filter capacitor and a second grid-tied point, and the third switch is disposed to control a connection between the third filter capacitor and a third grid-tied point.

It should be noted that the switch in this embodiment may be one or more of a plurality of types of switching transistors, such as a relay, a metal-oxide semiconductor field-effect transistor (MOSFET), a bipolar junction transistor (BJT), and an insulated gate bipolar transistor (IGBT), which are not enumerated in this embodiment. Each switch may include a first electrode, a second electrode, and a control electrode. The control electrode is configured to control on or off of the switch. When the switch is turned on, a current may be transmitted between the first electrode and the second electrode of the switch. Alternatively, when the switch is turned off, a current cannot be transmitted between the first electrode and the second electrode of the switch. Using the MOSFET as an example, the control electrode of the switch is a gate electrode, the first electrode of the switch may be a source electrode of the switch, and the second electrode may be a drain electrode of the switch; or the first electrode may be the drain electrode of the switch, and the second electrode may be the source electrode of the switch.

Structure 1 of the breaking unit 504 in this embodiment is described below with reference to FIG. 10.

Figure 10:
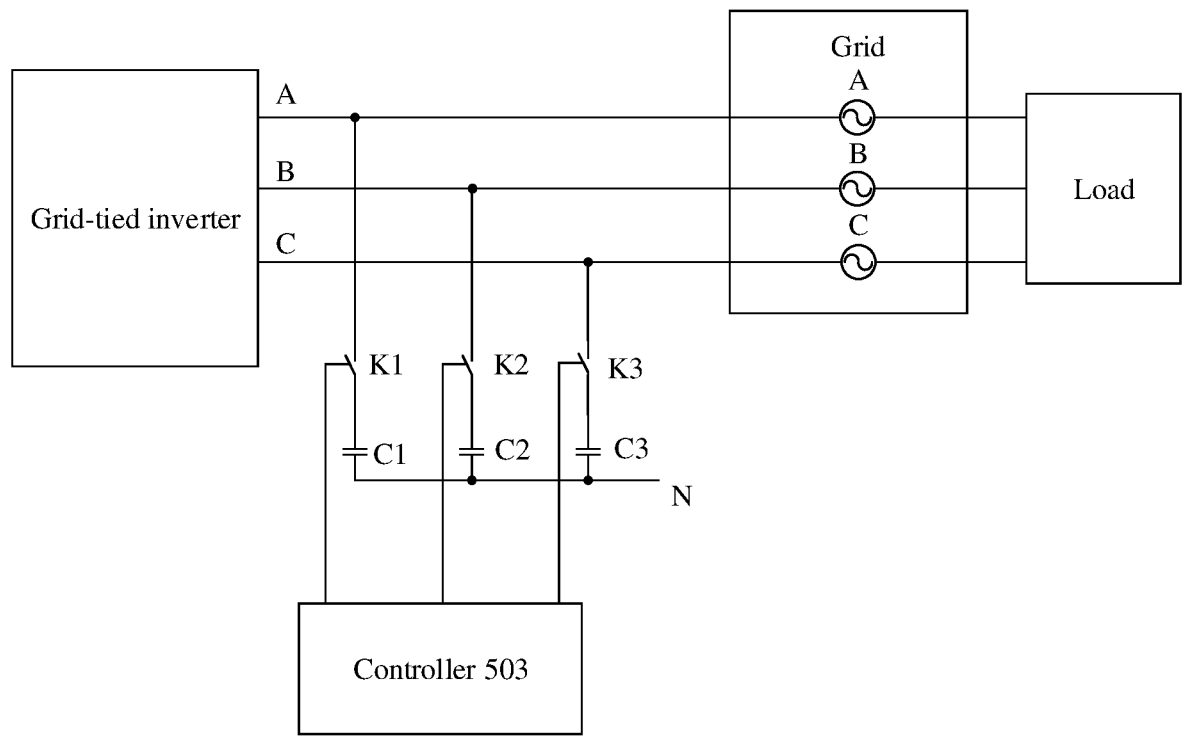
FIG. 10 is a schematic diagram of a structure of a breaking unit according to an embodiment.

FIG. 10 is a schematic diagram of a structure of a breaking unit 504 according to an embodiment. In FIG. 10, K1 forms the first switch, K2 forms the second switch, and K3 forms the third switch.

Connection relationships of the components in the breaking unit 504 shown in FIG. 10 may be as follows: A first electrode of K1 is connected to the first grid-tied point, a second electrode of K1 is connected to one end of a filter capacitor C1, a first electrode of K2 is connected to the second grid-tied point, a second electrode of K2 is connected to one end of a filter capacitor C2, a first electrode of K3 is connected to the third grid-tied point, a second electrode of K3 is connected to one end of a filter capacitor C3, and control electrodes of K1, K2, and K3 are all connected to the controller 503.

When the breaking unit 504 shown in FIG. 10 is used to control a connection between the filter capacitor and each of the output end of the grid-tied inverter and the grid, K1 is connected between the first grid-tied point and the filter capacitor C1, K2 is connected between the second grid-tied point and the filter capacitor C2, K3 is connected between the third grid-tied point and the filter capacitor C3, and the control electrodes of K1, K2, and K3 separately receive a control signal sent by the controller 503, and control, based on the control signal, a connection between the first grid-tied point and the filter capacitor C1, a connection between the second grid-tied point and the filter capacitor C2, and a connection between the third grid-tied point and the filter capacitor C3.

Structure 2:

If the filter capacitors are connected in a triangular shape, the breaking unit 504 may include a fourth switch and a fifth switch.

The fourth switch may be connected between a first filter capacitor and a first output end and is configured to connect the first filter capacitor to the first output end.

The fifth switch is connected between a second filter capacitor and a second output end and is configured to connect the second filter capacitor to the second output end.

The fourth switch is disposed to control a connection between the filter capacitor and a first grid-tied point, and the fifth switch is disposed to control a connection between the second filter capacitor and a second grid-tied point.

It should be noted that the foregoing connection locations of the fourth switch and the fifth switch are merely examples. In actual use, the fourth switch and the fifth switch may be connected between any two grid-tied points and filter capacitors.

Structure 2 of the breaking unit 504 in this embodiment is described below with reference to FIG. 11.

Figure 11:
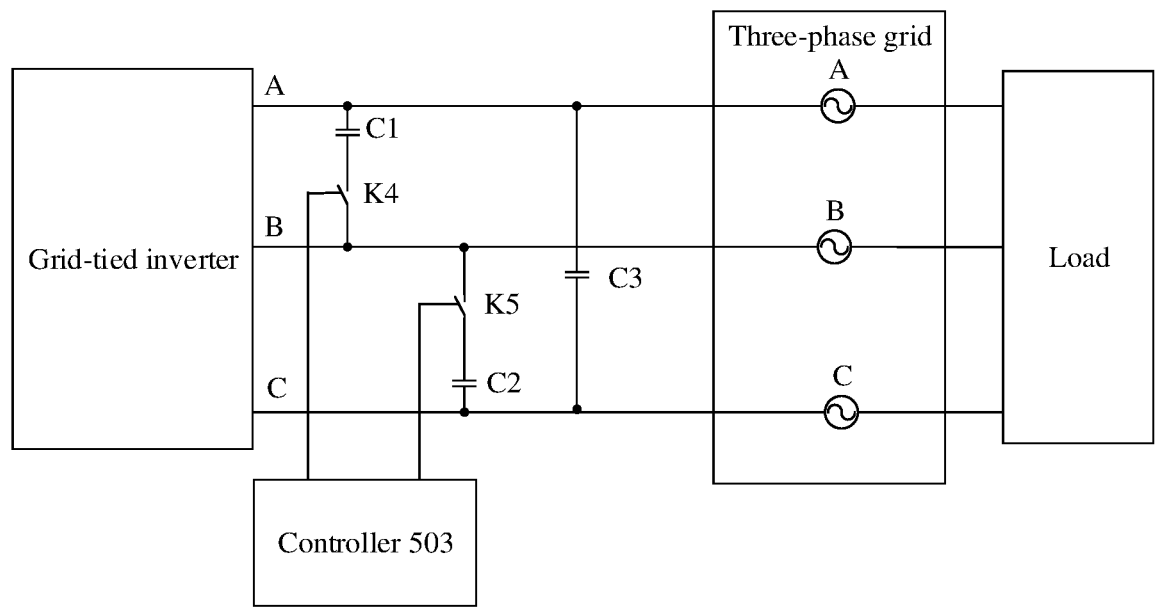
FIG. 11 is a schematic diagram of a structure of another breaking unit according to an embodiment.

FIG. 11 is a schematic diagram of a structure of a breaking unit 504 according to an embodiment. In FIG. 11, K4 forms the fourth switch, and K5 forms the fifth switch.

Connection relationships of the components in the breaking unit 504 shown in FIG. 11 may be as follows: A first electrode of K4 is connected to the first grid-tied point, a second electrode of K4 is connected to one end of a filter capacitor C1, a first electrode of K5 is connected to the second grid-tied point, a second electrode of K5 is connected to one end of a filter capacitor C2, and control electrodes of K4 and K5 both are connected to the controller 503.

V. Controller 503

The controller 503 is separately connected to the temperature detection unit 501, the current detection unit 502, the voltage detection unit 505, and the breaking unit 504. The controller 503 may receive the temperature detected by the temperature detection unit 501, the current detected by the current detection unit 502, and the voltage detected by the voltage detection unit 505, and when the received temperature exceeds the first threshold, the received current exceeds the second threshold, and the received voltage is beyond the preset threshold interval, control the breaking unit 504 to be disconnected.

In actual application, because the breaking unit 504 includes a switch, the controller 503 may adjust on/off of the switch to adjust a working state of the breaking unit 504. The controller 503 may be configured to: control connection/disconnection of the breaking unit 504 to implement a connection between the grid-tied inverter and the plurality of filter capacitors and control the breaking unit 504 to be connected to connect the grid-tied inverter to the plurality of filter capacitors.

If a switch in each circuit of the breaking unit 504 is a MOSFET, the controller 503 may be connected to a gate electrode of the MOSFET, and control on/off of the MOS transistor to control a connection between the output end of the grid-tied inverter and the plurality of filter capacitors. Alternatively, if a switch in each circuit of the breaking unit 504 is a BJT, the controller 503 may be connected to a base electrode of the BJT, and control on/off of the BJT to control a connection between the output end of the grid-tied inverter and the plurality of filter capacitors.

In implementation, the controller 503 may be any one of a micro control unit (MCU), a central processing unit (CPU), or a digital signal processor (DSP). Further, a form of the controller 503 is not limited to the foregoing example.

In actual use, the output end of the grid-tied inverter connected to the breaking unit 504 outputs a three-phase alternating current whose phase and amplitude always change. Therefore, to further reduce loss of on and off of the switch in the connected breaking unit 504, when determining that the received temperature exceeds the first threshold and the received current exceeds the second threshold, the controller 503 may detect voltages of the first grid-tied point, the second grid-tied point, and the third grid-tied point; when determining that a voltage value of the first grid-tied point is zero, the controller 503 may control the first switch to be turned off; when determining that a voltage value of the second grid-tied point is zero, the controller 503 may control the second switch to be turned off; and when determining that a voltage value of the third grid-tied point is zero, the controller 503 may control the third switch to be turned off.

A moment at which the switch in the breaking unit 504 is controlled to be turned off may be a moment at which a voltage of the switch in the breaking unit 504 is zero, to reduce switch loss of the breaking unit 504.

Figure 12:
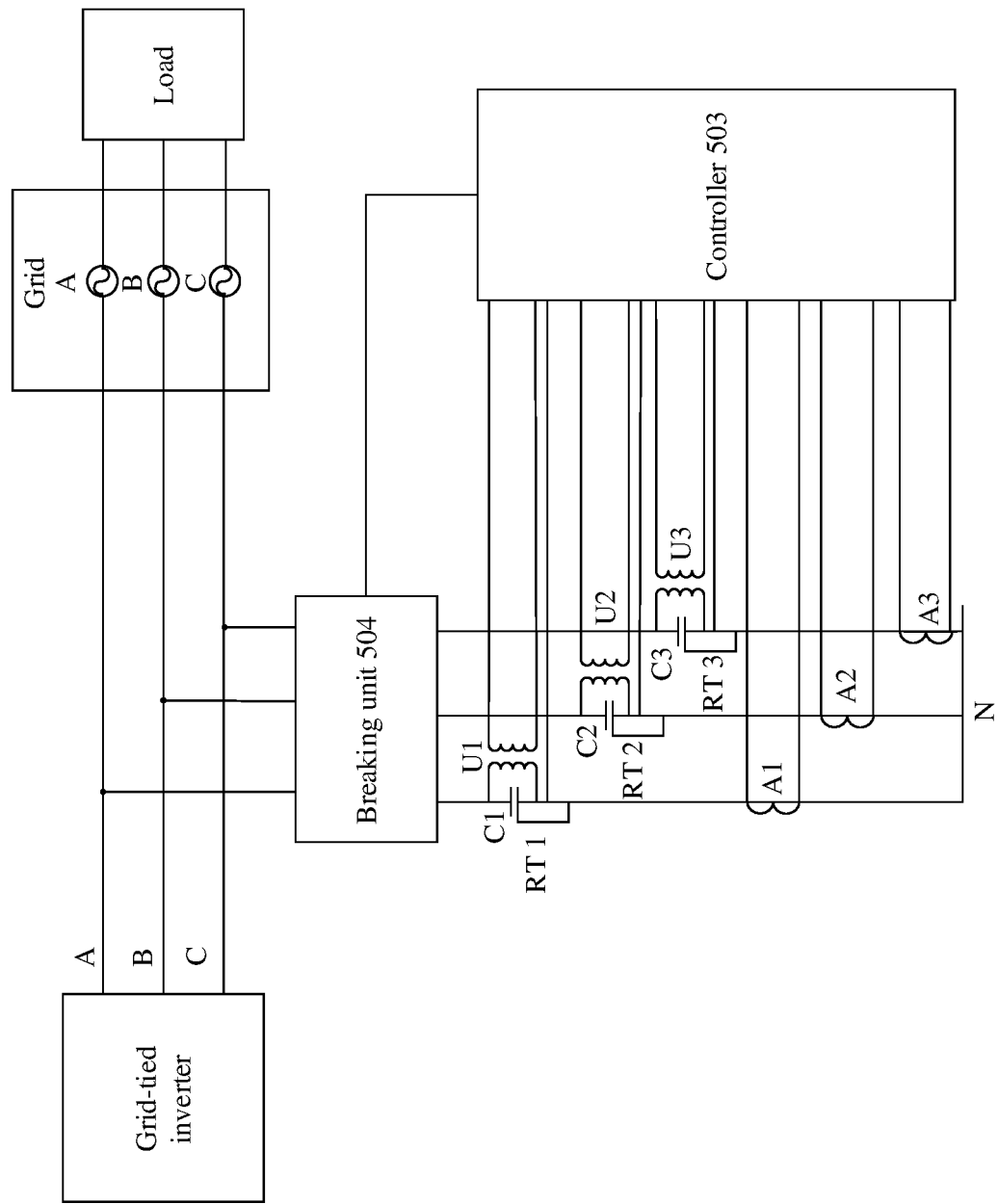
FIG. 12 is a schematic diagram of a structure of a fault detection apparatus according to an embodiment.

With reference to the foregoing description, for example, the fault detection apparatus 500 provided in this embodiment may be shown in FIG. 12.

The temperature detection unit 501 includes the temperature sensors RT 1, RT 2, and RT 3. RT 1 is in contact with the filter capacitor C1, RT 2 is in contact with the filter capacitor C2, RT 3 is in contact with the filter capacitor C3, and the temperature output ports of RT 1, RT 2, and RT 3 are connected to the controller 503.

The current detection unit 502 includes the current sensors A1, A2, and A3. The detection winding of A1 winds around the branch on which the filter capacitor C1 is located, the detection winding of A2 winds around the branch on which the filter capacitor C2 is located, the detection winding of A3 winds around the branch on which the filter capacitor C3 is located, and the current output ports of A1, A2, and A3 are all connected to the controller 503.

The voltage detection unit 505 includes the voltage sensors U1, U2, and U3. The detection winding of U1 is connected in parallel between the two ends of the filter capacitor C1, the detection winding of U2 is connected in parallel between the two ends of the filter capacitor C2, the detection winding of U3 is connected in parallel between the two ends of the filter capacitor C3, and the voltage output ports of U1, U2, and U3 are all connected to the controller 503.

The breaking unit 504 includes the switches K1, K2, and K3. K1 is connected between the first grid-tied point and the filter capacitor C1, K2 is connected between the second grid-tied point and the filter capacitor C2, K3 is connected between the third grid-tied point and the filter capacitor C3, and the control electrodes of K1, K2, and K3 are all connected to the controller 503.

When the fault detection apparatus 500 shown in FIG. 12 is used to detect whether the filter capacitors C1, C2, and C3 fail, RT 1, RT 2, and RT 3 detect temperatures of the three filter capacitors and output the detected temperatures to the controller 503. A1, A2, and A3 detect currents flowing through the three filter capacitors and output the detected currents to the controller 503. U1, U2, and U3 detect a voltage between two ends of each of the three filter capacitors and output the detected voltage to the controller 503. When any of the three received temperatures exceed the first threshold, any of the three received currents exceeds the second threshold, and any of the three received voltages is beyond the preset threshold interval, the controller 503 controls K1, K2, and K3 to be turned off. In this case, the filter capacitor is disconnected from the grid-tied inverter, to ensure that an alternating current that is output by the grid-tied inverter is normally tied to the grid.

Optionally, after controlling K1, K2, and K3 to be turned off, the controller 503 reports an alarm signal. The alarm signal is used to prompt a user that the filter capacitor fails.

Further, the foregoing description of the structure of the fault detection apparatus 500 is merely an example. In actual application, the fault detection apparatus 500 may use other structures based on different components in the temperature detection unit 501, the voltage detection unit 505, and the current detection unit 502, and different manners of connecting filter capacitors. The other structures are not described herein.

Figure 13:
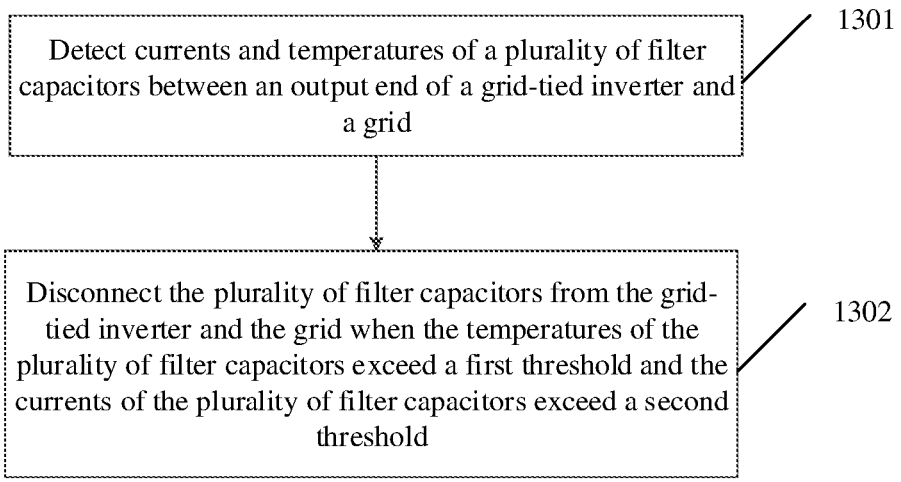
FIG. 13 is a schematic flowchart of a fault detection method according to an embodiment.

For the foregoing fault detection apparatus 500, the controller 503 may perform a fault detection method shown in FIG. 13 to accurately detect whether a filter capacitor fails, to ensure that an alternating current that is output by a grid-tied inverter is normally tied to a grid. The method mainly includes the following steps.

S1301. Detect currents and temperatures of a plurality of filter capacitors between an output end of a grid-tied inverter and a grid.

S1302. Disconnect the plurality of filter capacitors from the grid-tied inverter and the grid when the temperatures of the plurality of filter capacitors exceed a first threshold and the currents of the plurality of filter capacitors exceed a second threshold.

The output end of the grid-tied inverter may output a three-phase alternating current whose amplitude and phase always change. Therefore, when the filter capacitors are disconnected from the grid-tied inverter and the grid, the filter capacitor may be disconnected when a voltage value of a one-phase alternating current connected to the filter capacitor is zero.

Before the plurality of filter capacitors are disconnected from the grid-tied inverter and the grid, voltages of a first grid-tied point, a second grid-tied point, and a third grid-tied point are detected. When it is determined that the voltage of the first grid-tied point is zero, a first filter capacitor is disconnected from a first phase wire and a first output end. When it is determined that the voltage of the second grid-tied point is zero, a second filter capacitor is disconnected from a second phase wire and a second output end. When it is determined that the voltage of the third grid-tied point is zero, a third filter capacitor is disconnected from a third phase wire and a third output end.

A voltage between two ends of a filter capacitor may change when the filter capacitor fails. To accurately detect whether a filter capacitor fails, in the foregoing provided fault detection method, voltages of the plurality of filter capacitors may be further detected. When the temperatures of the plurality of filter capacitors exceed the first threshold, the currents of the plurality of filter capacitors exceed the second threshold, and the voltages of the plurality of filter capacitors are beyond a preset threshold interval, the plurality of filter capacitors are disconnected from the grid-tied inverter and the grid.

Based on the fault detection apparatus 500 provided in the embodiments, because parameters change when a filter capacitor fails, the controller 503 may accurately detect, based on a current flowing through the filter capacitor, a voltage between two ends of the filter capacitor, and a temperature of the filter capacitor, whether the filter capacitor fails. Therefore, when the fault detection method shown in FIG. 13 in this embodiment is used, further improvement in accuracy of filter capacitor failure detection is further facilitated.

The fault detection apparatus and the fault detection method may also be used in other fields, for example, in the fields in which generated electric energy needs to be tied to a grid, such as wind power generation, hydro power generation, and thermal power generation. The apparatus and the method may be used to accurately detect whether a filter capacitor configured to filter a high-frequency signal fails.

Figure 14:
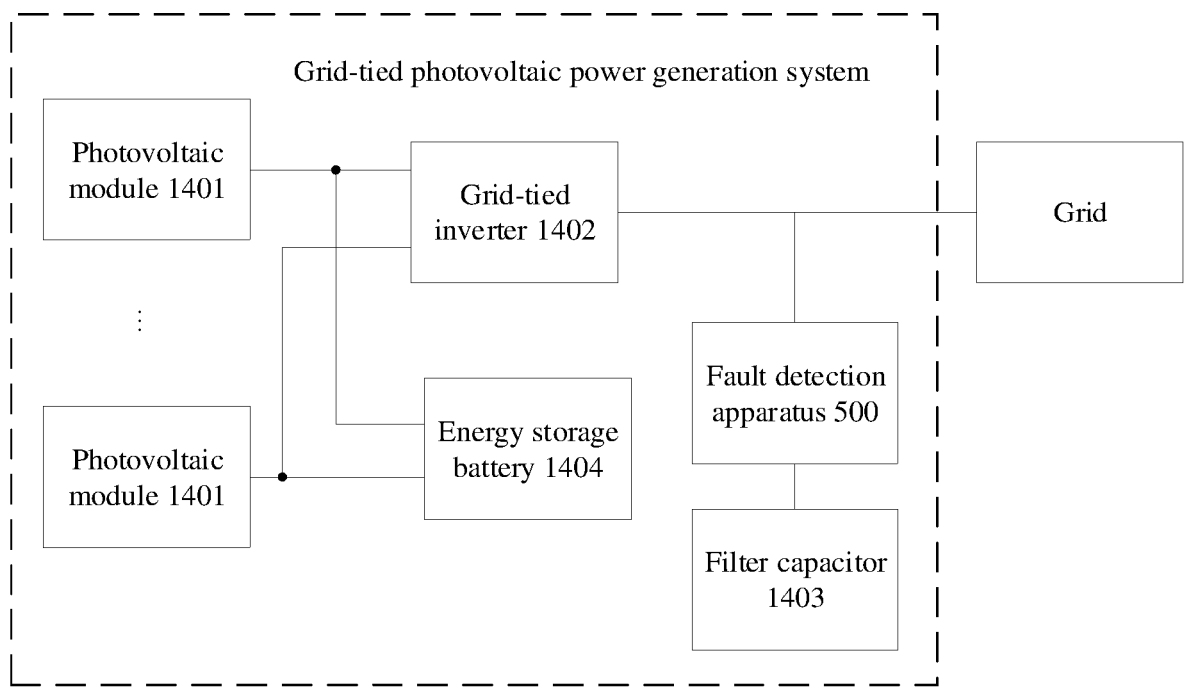
FIG. 14 is a schematic diagram of a structure of a grid-tied power generation system according to an embodiment.

Based on the foregoing description, an embodiment provides a grid-tied inverter. As shown in FIG. 14, the grid-tied inverter may include a plurality of photovoltaic modules 1401, a grid-tied inverter 1402, a plurality of filter capacitors 1403, and the fault detection apparatus 500.

The plurality of photovoltaic modules 1401 are connected to the grid-tied inverter 1402 and are configured to convert optical energy into a direct current and output the direct current to the grid-tied inverter 1402. The grid-tied inverter 1402 is separately connected to the plurality of filter capacitors 1403 and a grid and is configured to convert the received direct current into an alternating current, and then output the alternating current to the grid and the plurality of filter capacitors 1403. The plurality of filter capacitors 1403 is configured to: perform filtering processing on the received alternating current, and output an alternating current obtained after filtering processing to the grid. The fault detection apparatus 500 is coupled to the plurality of filter capacitors 1403 and is separately connected to the grid-tied inverter 1402 and the grid and is configured to detect whether the plurality of filter capacitors 1403 are faulty and disconnect the plurality of filter capacitors 1403 from the grid and the grid-tied inverter 1402 when the plurality of filter capacitors 1403 is faulty.

Optionally, the grid-tied photovoltaic power generation system 1400 may further include an energy storage battery 1404. The energy storage battery 1404 may store redundant electric energy generated by the plurality of photovoltaic modules 1401 when electric energy generated by the plurality of photovoltaic modules 1401 is greater than electric energy required by the grid, and output, when the electric energy generated by the plurality of photovoltaic modules 1401 is less than the electric energy required by the grid, the stored electric energy to the grid by using the grid-tied inverter 1402.

It is clear that a person of ordinary skill in the art can make various modifications and variations without departing from the scope of the embodiments.

What is claimed is:

1. A fault detection apparatus, comprising
    a temperature detection unit;
    a current detection unit; and
    a controller,
    wherein the temperature detection unit is coupled to a plurality of filter capacitors between an output end of a grid-tied inverter and a grid, and is configured to detect temperatures of the plurality of filter capacitors, and output the temperatures to the controller;
    wherein the current detection unit is coupled to the plurality of filter capacitors, and is configured to detect currents of the plurality of filter capacitors, and output the currents to the controller; and
    wherein the controller is separately connected to the temperature detection unit and the current detection unit, and is configured to:
    determine whether the received temperature has exceeded a first threshold and whether the received current has exceeded a second threshold, and determine whether the first threshold and second threshold are met simultaneously;
    in a case where only one of the first threshold and second threshold is met, maintain a connection between the output end of the grid-tied inverter and the plurality of filter capacitors; and
    in a case where the first threshold and second threshold are met simultaneously, disconnect the output end of the grid-tied inverter from the plurality of filter capacitors.

2. The fault detection apparatus according to claim 1, wherein the plurality of filter capacitors comprises:
    a first filter capacitor;
    a second filter capacitor; and
    a third filter capacitor, a first output end of the grid-tied inverter is separately connected to the first filter capacitor and a first phase wire of the grid, to form a first grid-tied point; a second output end of the grid-tied inverter is separately connected to the second filter capacitor and a second phase wire of the grid, to form a second grid-tied point; and a third output end of the grid-tied inverter is separately connected to the third filter capacitor and a third phase wire of the grid, to form a third grid-tied point.

3. The fault detection apparatus according to claim 2, wherein the temperature detection unit comprises:
a first temperature sensor;
a second temperature sensor; and
a third temperature sensor, one end of the first temperature sensor is configured to be coupled to the first filter capacitor, and the other end is connected to the controller, to detect a temperature of the first filter capacitor and output the temperature to the controller; one end of the second temperature sensor is configured to be coupled to the second filter capacitor, and the other end is connected to the controller, to detect a temperature of the second filter capacitor and output the temperature to the controller; and one end of the third temperature sensor is configured to be coupled to the third filter capacitor, and the other end is connected to the controller, to detect a temperature of the third filter capacitor and output the temperature to the controller.

4. The fault detection apparatus according to claim 3, wherein the current detection unit comprises:
a first current sensor;
a second current sensor; and
a third current sensor, one end of the first current sensor is configured to be coupled to the first filter capacitor, and the other end is connected to the controller, to detect a current of the first filter capacitor and output the current to the controller; one end of the second current sensor is configured to be coupled to the second filter capacitor, and the other end is connected to the controller, to detect a current of the second filter capacitor and output the current to the controller; and one end of the third current sensor is configured to be coupled to the third filter capacitor, and the other end is connected to the controller, to detect a current of the third filter capacitor and output the current to the controller.

5. The fault detection apparatus according to claim 3, further comprising:
a voltage detection unit connected to the controller, wherein the voltage detection unit is coupled to the plurality of filter capacitors, and is configured to detect voltages of the plurality of filter capacitors, and output the detected voltages to the controller; and the controller is configured to disconnect the output end of the grid-tied inverter from the plurality of filter capacitors when the received temperature exceeds the first threshold, the received current exceeds the second threshold, and the received voltage is beyond a preset threshold interval.

6. The fault detection apparatus according to claim 5, wherein the voltage detection unit comprises:
a first voltage sensor;
a second voltage sensor; and
a third voltage sensor, one end of the first voltage sensor is configured to be coupled to the first filter capacitor, and the other end is connected to the controller, to detect a first voltage between two ends of the first filter capacitor and output the first voltage to the controller; one end of the second voltage sensor is configured to be coupled to the second filter capacitor, and the other end is connected to the controller, to detect a second voltage between two ends of the second filter capacitor and output the second voltage to the controller; and one end of the third voltage sensor is configured to be coupled to the third filter capacitor, and the other end is connected to the controller, to detect a third voltage between two ends of the third filter capacitor and output the third voltage to the controller.

7. The fault detection apparatus according to claim 3, further comprising:
a breaking unit connected to the controller, wherein the breaking unit is connected between the output end of the grid-tied inverter and the plurality of filter capacitors and is configured to be disconnected or connected under control of the controller.

8. The fault detection apparatus according to claim 7, wherein the breaking unit comprises:
a first switch;
a second switch; and
a third switch, the first filter capacitor, the second filter capacitor, and the third filter capacitor are connected in a star shape to the first phase wire, the second phase wire, and the third phase wire; the first switch is connected between the first filter capacitor and the first output end, and is configured to connect the first filter capacitor to the first output end; the second switch is connected between the second filter capacitor and the second output end, and is configured to connect the second filter capacitor to the second output end; and the third switch is connected between the third filter capacitor and the third output end, and is configured to connect the third filter capacitor to the third output end.

9. The fault detection apparatus according to claim 7, wherein the breaking unit comprises:
a fourth switch; and
a fifth switch, the first filter capacitor, the second filter capacitor, and the third filter capacitor are connected in a triangle shape to the first phase wire, the second phase wire, and the third phase wire; the fourth switch is connected between the first filter capacitor and the first output end, and is configured to connect the first filter capacitor to the first output end; and the fifth switch is connected between the second filter capacitor and the second output end, and is configured to connect the second filter capacitor to the second output end.

10. The fault detection apparatus according to claim 8, wherein the controller is further configured to: when determining that the received temperature exceeds the first threshold and the received current exceeds the second threshold, detect voltages of the first grid-tied point, the second grid-tied point, and the third grid-tied point; when determining that a voltage value of the first grid-tied point is zero, control the first switch to be turned off; when determining that a voltage value of the second grid-tied point is zero, control the second switch to be turned off; and when determining that a voltage value of the third grid-tied point is zero, control the third switch to be turned off.

11. A grid-tied photovoltaic power generation system, comprising:
the fault detection apparatus according to claim 1, comprising the temperature detection unit, the current detection unit, and the controller, wherein the grid-tied photovoltaic power generation system further comprises the plurality of filter capacitors to which the temperature detection unit is coupled and the grid-tied inverter to which the plurality of filter capacitors are coupled; and a plurality of photovoltaic modules;

wherein the plurality of photovoltaic modules are connected to the grid-tied inverter, and are configured to convert optical energy into a direct current, and output the direct current to the grid-tied inverter; the grid-tied inverter is separately connected to the plurality of filter capacitors and a grid, and is configured to convert the received direct current into an alternating current, and then output the alternating current to the grid and the plurality of filter capacitors; the plurality of filter capacitors are configured to: perform filtering processing on the received alternating current, and output an alternating current obtained after filtering processing to the grid; and the fault detection apparatus is coupled to the plurality of filter capacitors and is separately connected to the grid-tied inverter and the grid, and is configured to detect whether the plurality of filter capacitors are faulty, and disconnect the plurality of filter capacitors from the grid-tied inverter when the plurality of filter capacitors are faulty.

12. A fault detection method, comprising:

detecting currents and temperatures of a plurality of filter capacitors between an output end of a grid-tied inverter and a grid;

determining whether a temperature of at least one of the plurality of filter capacitors has exceeded a first threshold and whether a current of at least one of the plurality of filter capacitors has exceeded a second threshold, and determining whether the first threshold and second threshold are met simultaneously;

in a case where only one of the first threshold and second threshold is met, maintaining a connection between the output end of the grid-tied inverter and the plurality of filter capacitors; and in a case where the first threshold and the second threshold are met simultaneously, disconnecting the plurality of filter capacitors from the grid-tied inverter and the grid.

13. The method according to claim 12, further comprising:

detecting voltages of the plurality of filter capacitors; and determining whether at least one voltage in the voltages of the plurality of filter capacitors is beyond a preset threshold interval; and wherein disconnecting the plurality of filter capacitors from the grid-tied inverter and the grid further comprises disconnecting the plurality of filter capacitors from the grid-tied inverter and the grid when the first threshold and the second threshold are met simultaneously and the voltages of the plurality of filter capacitors are simultaneously beyond a preset threshold interval.

14. The method according to claim 12, wherein the plurality of filter capacitors comprise a first filter capacitor, a second filter capacitor, and a third filter capacitor; a first output end of the grid-tied inverter is separately connected to the first filter capacitor and a first phase wire of the grid, to form a first grid-tied point; a second output end of the grid-tied inverter is separately connected to the second filter capacitor and a second phase wire of the grid, to form a second grid-tied point; and a third output end of the grid-tied inverter is separately connected to the third filter capacitor and a third phase wire of the grid, to form a third grid-tied point.

15. The method according to claim 14, wherein the disconnecting the plurality of filter capacitors from the grid-tied inverter and the grid further comprises:

detecting voltages of the grid-tied point, the second grid-tied point, and the third grid-tied point; when determining that the voltage of the first grid-tied point is zero, disconnecting the first filter capacitor from the first phase wire and the first output end; when determining that the voltage of the second grid-tied point is zero, disconnecting the second filter capacitor from the second phase wire and the second output end; and when determining that the voltage of the third grid-tied point is zero, disconnecting the third filter capacitor from the third phase wire and the third output end.

* * * * *